(12) United States Patent
Ikebe et al.

(10) Patent No.: US 11,249,385 B2
(45) Date of Patent: Feb. 15, 2022

(54) REFLECTIVE MASK BLANK, REFLECTIVE MASK, METHOD OF MANUFACTURING SAME, AND METHOD OF MANUFACTURING SEMICONDUCTOR DEVICE

(71) Applicant: HOYA CORPORATION, Tokyo (JP)

(72) Inventors: Yohei Ikebe, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 449 days.

(21) Appl. No.: 16/477,771

(22) PCT Filed: Jan. 16, 2018

(86) PCT No.: PCT/JP2018/000959
§ 371 (c)(1),
(2) Date: Jul. 12, 2019

(87) PCT Pub. No.: WO2018/135467
PCT Pub. Date: Jul. 26, 2018

(65) Prior Publication Data
US 2019/0361338 A1  Nov. 28, 2019

(30) Foreign Application Priority Data

Jan. 17, 2017 (JP) .............................. JP2017-005773

(51) Int. Cl.
*G03F 1/24* (2012.01)
*G03F 1/26* (2012.01)
*G03F 7/20* (2006.01)

(52) U.S. Cl.
CPC ................. *G03F 1/24* (2013.01); *G03F 1/26* (2013.01); *G03F 7/2004* (2013.01)

(58) Field of Classification Search
CPC ............. G03F 1/24; G03F 1/26; G03F 7/2004
See application file for complete search history.

(56) References Cited

U.S. PATENT DOCUMENTS

| | | |
|---|---|---|
| 2003/0031934 A1 | 2/2003 | Akbar |
| 2005/0238963 A1 | 10/2005 | Ishibashi et al. |
| 2007/0128528 A1 | 6/2007 | Hess et al. |
| 2007/0178393 A1 | 8/2007 | Park et al. |
| 2009/0017387 A1 | 1/2009 | Shoki |
| 2009/0253055 A1 | 10/2009 | Hayashi et al. |
| 2011/0104595 A1 | 5/2011 | Hayashi et al. |
| 2012/0009511 A1 | 1/2012 | Dmitriev |
| 2013/0156939 A1 | 6/2013 | Budach et al. |
| 2013/0164660 A1 | 6/2013 | Hayashi |
| 2013/0236818 A1 | 9/2013 | Lee |
| 2013/0323630 A1 | 12/2013 | Maeshige et al. |
| 2014/0205936 A1 | 7/2014 | Kodera et al. |
| 2014/0295330 A1 | 10/2014 | Pruneri et al. |
| 2015/0268561 A1 | 9/2015 | Lu et al. |
| 2015/0301442 A1 | 10/2015 | Kageyama et al. |
| 2016/0124298 A1 | 5/2016 | Hamamoto et al. |
| 2016/0238924 A1 | 8/2016 | Burkhardt et al. |
| 2017/0263444 A1 | 9/2017 | Shoki et al. |
| 2018/0149962 A1 | 5/2018 | Kobayashi et al. |
| 2018/0356719 A1 | 12/2018 | Ikebe et al. |
| 2019/0361338 A1 | 11/2019 | Ikebe et al. |
| 2019/0361388 A1 | 11/2019 | Morishita |
| 2019/0384157 A1 | 12/2019 | Ikebe et al. |
| 2021/0103209 A1 | 4/2021 | Nakagawa et al. |

FOREIGN PATENT DOCUMENTS

| | | |
|---|---|---|
| CN | 102089860 A | 6/2011 |
| JP | 08330221 A | 12/1996 |
| JP | 2004-39884 A | 2/2004 |
| JP | 2004-207593 A | 7/2004 |
| JP | 2008-103481 A | 5/2008 |
| JP | 2008244323 A | 10/2008 |
| JP | 2010-080659 A | 4/2010 |
| JP | 2012009537 A | 1/2012 |
| JP | 4978626 B | 7/2012 |
| JP | 2013-531375 A | 8/2013 |
| JP | 2013225662 A | 10/2013 |
| JP | 2014197628 A | 10/2014 |
| JP | 2015-015420 A | 1/2015 |
| JP | 2015-028999 A | 2/2015 |
| JP | 2015-088742 A | 5/2015 |
| JP | 5883249 B | 2/2016 |
| JP | 6107829 B | 3/2017 |
| TW | 201614362 A | 4/2016 |
| WO | 2010/007955 A1 | 1/2010 |

(Continued)

OTHER PUBLICATIONS

International Application PCT/JP2018/000961, English Translation of International Search Report dated Mar. 20, 2018, 4 pages.
International Application PCT/JP2018/000959, English Translation of International Search Report dated Apr. 17, 2018, 4 pages.
SP11201906154P, "Invitation to Respond to Written Opinion", dated Mar. 24, 2021, 6 pages.
SG11201906154P, "Invitation to Respond to Written Opinion", dated Jun. 2, 2020, 7 pages.

(Continued)

*Primary Examiner* — Christopher G Young

(74) *Attorney, Agent, or Firm* — Kilpatrick Townsend & Stockton LLP

(57) ABSTRACT

Provided are a reflective mask blank and a reflective mask that are capable of reducing the shadowing effect of EUV lithography and forming a fine pattern. As a result, a semiconductor device can be stably manufactured with high transfer accuracy. The reflective mask blank has a multilayer reflective film and a phase shift film that causes a shift in the phase of EUV light on a substrate in that order, wherein the phase shift film comprises a single layer film or multilayer film of two or more layers and is made of a material comprising tantalum (Ta) and titanium (Ti).

18 Claims, 5 Drawing Sheets

(56) References Cited

FOREIGN PATENT DOCUMENTS

| WO | 2012/0026463 A1 | 3/2012 |
| WO | 2012/105698 A1 | 8/2012 |
| WO | 2013/062104 A1 | 5/2013 |
| WO | 2016/204051 A1 | 12/2016 |
| WO | 2017090485 A1 | 6/2017 |

OTHER PUBLICATIONS

U.S. Appl. No. 16/477,801, "Non-Final Office Action", dated Jun. 3, 2021, 15 pages.
JP2018-53327, "Notice of Reasons for Refusal" with Machine Translation, dated Sep. 28, 2021, 5 pages.
TW107101645, Office Action dated Nov. 2, 2021, 6 pages.

Film thickness of phase shift film (upper and lower layer)(nm)

REFLECTIVE MASK BLANK, REFLECTIVE MASK, METHOD OF MANUFACTURING SAME, AND METHOD OF MANUFACTURING SEMICONDUCTOR DEVICE

CROSS-REFERENCE TO RELATED APPLICATIONS

This application is the National Phase under 35 U.S.C. § 371 of PCT International Application No. PCT/JP2018/00959, filed on Jan. 16, 2018, which claims benefit an priority to Japanese patent application No. 2017-005773, filed on Jan. 17, 2017, and which is incorporated by reference herein in its entirety.

TECHNICAL FIELD

The present disclosure relates to a reflective mask blank serving as a master for fabricating an exposure mask used in the manufacturing of semiconductor devices and the like, a reflective mask, a method of fabricating the same, and a method of manufacturing a semiconductor device.

BACKGROUND ART

The types of light sources of exposure apparatuses used in the manufacturing of semiconductor devices are evolving while gradually using shorter wavelengths, as is indicated by the g-line having a wavelength of 436 nm, i-line having a wavelength of 365 nm, KrF lasers having a wavelength of 248 nm and ArF lasers having a wavelength of 193 nm, and EUV lithography using extreme ultraviolet (EUV) light, in which the wavelength is in the vicinity of 13.5 nm, has been developed in order to realize transfer of even finer patterns. In EUV lithography, a reflective mask is used due to the small number of materials that are transparent to EUV light. In this reflective mask, the basic structure consists of mask structure in which a multilayer reflective film that reflects exposure light is formed on a low thermal expansion substrate and a desired transfer pattern is formed on a protective film for protecting the multilayer reflective film. In addition, based on the configuration of the transfer pattern, typical examples of reflective masks are binary reflective masks having a comparatively thick absorber pattern that adequately absorbs EUV light, and phase shift reflective masks (halftone phase shift reflective masks) composed of a comparatively thin absorber pattern that generates reflected light in which the phase is nearly completely inverted (phase inversion of about 180° C.) relative to light reflected from the multilayer reflective film. Phase shift reflective masks (halftone phase shift reflective masks) allow the obtaining of high transferred optical image contrast due to phase shift effects in the same manner as transmissive optical phase shift masks, thereby making it possible to improve resolution. In addition, a highly accurate, fine phase shift pattern can be formed due to the thin film thickness of the absorber pattern (phase shift pattern) of the phase shift reflective mask.

Projection optical systems composed of a large number of reflecting mirrors are used in EU lithography based on the relationship with light transmittance. As a result of EU light entering a reflective mask on an angle, these multiple reflecting mirrors are prevented from blocking the projected light (exposure light). It is currently common to use an angle of 6° for the incident angle relative to the perpendicular plane of the reflective mask substrate. Studies are proceeding on methods for improving the numerical aperture (NA) of the projection optical system as well as achieving a more oblique incident angle of about 8°.

EUV lithography has a unique problem referred to as the shadowing effect as a result of exposure light entering on an oblique angle. The shadowing effect refers to a phenomenon in which the dimensions and/or location of a pattern formed by transfer change due to the formation of shadows caused by the entry of exposure light into an absorber pattern having a three-dimensional structure on an oblique angle. The three-dimensional structure of the absorber pattern serves as a wall that allows the formation of a shadow on the shady side, thereby causing the dimensions and/or location of the pattern formed by transfer to change. For example, differences occur in the dimensions and location of two transfer patterns resulting in a decrease in transfer accuracy between the case of the orientation of the arranged absorber pattern being parallel to the direction of oblique incident light and the case of the orientation of the arranged absorber pattern being perpendicular.

Technologies relating to such reflective masks for EUV lithography and mask blanks used for the fabrication thereof are disclosed in Patent Documents 1 to 3. In addition, Patent Document 1 contains a disclosure regarding the shadowing effect. In the past, decreases in transfer accuracy caused by the shadowing effect have been attempted to be suppressed by making the film thickness of a phase shift pattern comparative thinner than the case of a binary reflective mask by using a phase shift reflective mask as a reflective mask for EUV lithography.

PRIOR ART DOCUMENTS

Patent Documents

Patent Document 1: JP 2010-080659 A
Patent Document 2: JP 2004-207593 A
Patent Document 3: JP 2004-39884 A

DISCLOSURE OF THE INVENTION

Problems to be Solved by the Invention

The electrical properties and performance of semiconductor devices improve the finer the pattern and the greater the accuracy of the pattern dimensions and location, thereby making it possible to improve the degree of integration and reduce chip size. Consequently, EUV lithography requires an even higher level of high-precision, fine-dimension pattern transfer performance compared to the conventional art. At present, half-pitch 16 nm (hp16 nm) next generation-compatible ultrafine, high-precision pattern formation is required. In order to satisfy this requirement, even greater reductions in thickness are required in order to reduce shadowing effects. In the case of EUV exposure in particular, it is necessary to reduce film thickness of the absorber film (phase shift film) to less than 60 nm and preferably to may be 50 nm or less.

As is disclosed in Patent Documents 1 to 3, Ta has conventionally been used as a material that forms the absorber film (phase shift film) of reflective mask blanks. However, the refractive index of Ta in EUV light (having a wavelength of 13.5 nm, for example) is about 0.943, and even if phase shift effects are utilized, the limit on the reduction in thickness of an absorber film (phase shift film) formed with Ta alone is 60 nm. In order to reduce thickness even further, a metal material, for example, having a low refractive index n (large phase shift effect) can be used. As is descried in FIG. 5 of Patent Document 1, for example, examples of metal materials having a low refractive index at a wavelength of 13.5 nm include Mo (n=0.921) and Ru (n=0.888). However, Mo is extremely susceptible to oxidation resulting in concerns over cleaning resistance, while Ru has a low etching rate thereby making processing and repair difficult.

With the foregoing in view, an aspect of the present disclosure is to provide a reflective mask blank capable of reducing the shadowing effect of reflective masks while also enabling the formation of a fine and highly accurate phase shift pattern, a reflective mask fabricated thereby, and a method of manufacturing a semiconductor device.

Means for Solving the Problems

The present disclosure has the following configurations in order to solve the aforementioned problems.
(Configuration 1)
A reflective mask blank having a multilayer reflective film and a phase shift film that causes a shift in the phase of EUV light on a substrate in that order; wherein,
the phase shift film comprises a single layer film or multilayer film of two or more layers and is made of a material comprising tantalum (Ta) and titanium (Ti).
(Configuration 2)
The reflective mask blank described in Configuration 1, wherein the phase shift film has a structure with laminating a lower layer film and an upper layer film in that order from the substrate side,
the lower layer film is made of a material comprising tantalum (Ta), titanium (Ti) and nitrogen (N), and
the upper layer film is made of a material comprising tantalum (Ta), titanium (Ti) and oxygen (O).
(Configuration 3)
The reflective mask blank described in Configuration 1, wherein the phase shift film has a structure with laminating a lower layer film and an upper layer film in that order from the substrate side,
the lower layer film is made of a material comprising tantalum (Ta), titanium (Ti) and nitrogen (N), and
the refractive index of the upper layer film in EUV light is larger than the refractive index of the lower layer film in EUV light and smaller than 1.
(Configuration 4)
The reflective mask blank described in Configuration 3, wherein the upper layer film is made of a material comprising a silicon compound.
(Configuration 5)
The reflective mask blank described in any of Configurations 1 to 4, wherein the reflective mask blank further comprises a protective film between the multilayer reflective film and the phase shift film, and
the protective film is made of a material comprising ruthenium (Ru).
(Configuration 6)
The reflective mask blank described in any of Configurations 1 to 5, wherein the reflective mask blank further comprises a conductive film on the side opposite from the side of the substrate provided with the multilayer reflective film, and
the conductive film is made of a material, and the transmittance of the material at least in light having a wavelength of 532 nm is not less than 20%.

(Configuration 7)
A reflective mask having a phase shift pattern obtained by patterning the phase shift film in the reflective mask blank described in any of Configurations 1 to 6.
(Configuration 8)
A method of fabricating a reflective mask, including:
forming a resist pattern on the phase shift film of the reflective mask blank described in any of Configurations 1 to 6, and
forming a phase shift pattern by patterning the phase shift film by using the resist pattern as a mask and dry etching with a dry etching gas containing a chlorine-based gas and substantially free of oxygen.
(Configuration 9)
A method of manufacturing a semiconductor device, having a process for placing the reflective mask described in Configuration 7 in an exposure apparatus having an exposure light source that emits EUV light, and transferring a transfer pattern to a resist film formed on a transferred substrate.

Effects of the Invention

According to the reflective mask blank of the present disclosure (and the reflective mask fabricated thereby), the film thickness of a phase shift film can be reduced, shadowing effect can be reduced, and a fine and highly accurate phase shift pattern can be formed having a stable cross-sectional shape with little sidewall roughness. Thus, a reflective mask fabricated using a reflective mask blank employing this structure enables the fine and highly accurate formation of a phase shift pattern per se formed on the mask, while also being able to prevent reductions in accuracy during transfer attributable to shadowing. In addition, a method of manufacturing a fine and highly accurate semiconductor device can be provided by carrying out EUV lithography using this reflective mask.

BRIEF DESCRIPTION OF THE DRAWINGS

FIGS. 5(a)-5(b) are drawings for explaining the shadowing effect of Example 1, wherein
FIG. 5(a) is a mask pattern layout drawing (top view) as viewed from the upper surface of the mask, and FIG. 5(b) resist pattern overhead view as viewed from the upper surface of a transferred resist pattern.

EMBODIMENTS FOR CARRYING OUT THE DISCLOSURE

Figure 1:
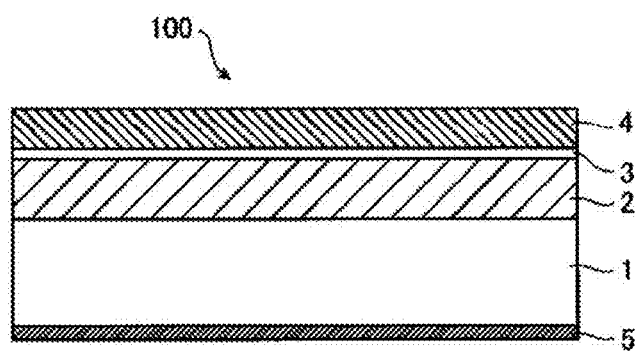
FIG. 1 is a cross-sectional schematic diagram of main portions for explaining the general configuration of a reflective mask blank according to the present disclosure.

The following provides a detailed explanation of embodiments of the present disclosure with reference to the drawings. Furthermore, the following embodiments merely indicate one form when embodying the present disclosure, and do not limit the present disclosure to the scope thereof. Furthermore, the same reference symbols are used to indicate identical or corresponding portions in the drawings and explanations thereof may be simplified or omitted.

<Configuration of Reflective Mask Blank and Method of Fabricating Same>

FIG. 1 is a cross-sectional schematic diagram of main portions for explaining the configuration of the reflective mask blank according to the present disclosure. As is indicated in the drawing, a reflective mask blank 100 has a mask blank substrate 1 (to also be simply referred to as "substrate 1"), a multilayer reflective film 2 formed on a first main surface (front side) that reflects exposure light in the form of EUV light, a protective film 3 provided to protect the multilayer reflective film 2 that is formed with a material having resistance to etchant used when patterning a phase shift film 4 to be subsequently described and resistance to cleaning solution, and a phase shift film 4 that absorbs EUV light, wherein these films are laminated in this order. In addition, a back side conductive film 5 for electrostatic chucking is formed on a second main surface (back side) of the substrate 1.

In the present description, "having a multilayer reflective film 2 on a main surface of the mask blank substrate 1" includes not only to the case of the multilayer reflective film 2 being disposed in contact with the surface of the mask blank substrate 1, but also the case of having another film between the mask blank substrate 1 and the multilayer reflective film 2. This applies similarly to other films as well. For example, "having a film B on a film A" includes not only the case of film A and film B being disposed in direct contact, but also the case of having another film between the film A and the film B. In addition, in the present description, "film A being disposed in direct contact with film B" refers to film A and film B being disposed in direct contact without interposing another film between the film A and the film B.

In the present description, the phase shift film being "composed of a material containing tantalum (Ta) and titanium (Ti)" refers to the phase shift film at least being substantially composed with a material containing tantalum (Ta) and titanium (Ti). In addition, the phase shift film "being composed of a material containing (comprising) tantalum (Ta) and titanium (Ti)" may refer to the phase shift film being composed only of a material containing tantalum (Ta) and titanium (Ti). In addition, each of these cases includes unavoidably contaminating impurities being contained in the phase shift film.

The following provides an explanation for each layer.

<<Substrate>>

A substrate having a low thermal expansion coefficient within a range of 0 ppb/° C.±5 ppb/° C. is used for the substrate 1 in order to prevent strain of the phase shift pattern caused by heat during exposure with EUV light. Examples of materials having a low thermal expansion coefficient within this range include $SiO_2$-$TiO_2$-based glass, multi-component glass ceramics and the like.

The first main surface of the substrate 1 on the side where the transfer pattern (which is composed by a phase shift film to be subsequently described) is formed is subjected to surface processing to a high degree of flatness at least from the viewpoints of obtaining pattern transfer accuracy and positional accuracy. In the case of EUV exposure, flatness in a region measuring 132 mm×132 mm of the main surface of the substrate 12 on which a transfer pattern is formed may not be more than 0.1 µm, not more than 0.05 µm, or and not more than 0.03 µm. In addition, the second main surface on the opposite side from the side on which the absorber film is formed is a surface that is electrostatically chucked when placing in an exposure apparatus, and the flatness thereof in a region measuring 132 mm×132 mm may not be more than 0.1 µm, not more than 0.05 µm, or not more than 0.03 µm. Furthermore, the flatness of the second main surface in the reflective mask blank 100 in a region measuring 142 mm×142 mm may not be more than 1 µm, not more than 0.5 µm, or not more than 0.3 µm.

In addition, the height of surface smoothness of the substrate 1 is also an extremely important parameter. The surface roughness of the first main surface of the substrate 1 on which a phase shift pattern for transfer is formed in terms of root mean square (RMS) roughness may not be more than 0.1 nm. Furthermore, surface smoothness can be measured with an atomic force microscope.

Moreover, the substrate 1 may have high rigidity to prevent deformation caused by film stress of a film formed thereon (such as the multilayer reflective film 2). In particular, the substrate 1 may have a high Young's modulus of not less than 65 GPa.

<<Multilayer Reflective Film>>

The multilayer reflective film 2 imparts a function that reflects EUV light in a reflective mask, and the multilayer reflective film 2 has the configuration of a multilayer film in which each layer composed mainly of elements having different refractive indices is cyclically laminated.

In general, a multilayer film obtained by alternately laminating roughly 40 to 60 cycles of a thin film of high refractive index material in the form of a light element or compound thereof (high refractive index layer) and a thin film of a low refractive index material in the form of a heavy element or compound thereof (low refractive index layer) is used for the multilayer reflective film 2. The multilayer film may have a structure obtained by laminating for a plurality of cycles, with one cycle consisting of a laminated structure of a high refractive index layer/low refractive index layer, obtained by laminating a high refractive index layer and low refractive index layer in that order starting from the side of the substrate 1, or the multilayer film may have a structure obtained by laminating for a plurality of cycles, with one cycle consisting of a laminated structure of low refractive index layer/high refractive index layer, obtained by laminating a low refractive index layer and high refractive index layer in that order starting from the side of the substrate 1. Furthermore, the layer on the uppermost side of the multilayer reflective film 2, namely the front side layer of the multilayer reflective film 2 on the opposite side from the substrate 1, may have a high refractive index layer. In the aforementioned multilayer film, in the case of laminating for a plurality of cycles, with one cycle consisting of a laminated structure of a high refractive index layer/low refractive index layer obtained by laminating a high refractive index layer and a low refractive index layer in that order on the substrate 1, the uppermost layer is a low refractive index layer. In this case, the low refractive index layer ends up being oxidized easily if it composes the uppermost side of the multilayer reflective film 2 and reflectance of the reflective mask decreases. Consequently, the multilayer reflective film 2 may have obtained by further forming a high refractive index layer on the low refractive index layer of the uppermost layer. On the other hand, in the aforementioned multilayer film, in the case of laminating for a plurality of cycles, with one cycle consisting of a laminated structure of a low refractive index layer/high refractive index layer obtained by laminating a low refractive index layer and high refractive index layer in that order starting from the side of the substrate 1, since the uppermost layer is a high refractive index layer, the multilayer reflective film 2 can be used as is.

In the present embodiment, a layer containing silicon (Si) is used as a high refractive index layer. The material containing Si may be Si alone or an Si compound containing Si and boron (B), carbon (C), nitrogen (N) and oxygen (O). As a result of using a layer containing Si as a high refractive index layer, a reflective mask for EUV lithography is obtained that demonstrates superior reflectance of EUV light. In addition, in the present embodiment, a glass substrate may have used for the substrate 1. Si also demonstrates superior adhesiveness with glass substrates. In addition, a metal selected from molybdenum (Mo), ruthenium (Ru), rhodium (Rh) and platinum (Pt), or an alloy thereof, is used as a low refractive index layer. For example, a Mo/Si cyclically laminated film, obtained by alternately laminating an Mo film and Si film for about 40 to 60 cycles, may have used for the multilayer reflective film 2 with respect to EUV light having a wavelength of 13 nm to 14 nm. Furthermore, the uppermost layer of the multilayer reflective film 2 in the form of a high refractive index layer may be formed with silicon (Si), and a silicon oxide layer containing silicon and oxygen may be formed between the uppermost layer (Si) and the Ru-based protective film 3. As a result, resistance of the mask to cleaning can be improved.

The reflectance of this reflective multilayer film 2 alone is normally not less than 65% and the upper limit thereof is normally 73%. Furthermore, the thickness and number of cycles of each layer composing the multilayer reflective film 2 are suitably selected according to exposure wavelength so as to satisfy Bragg's law. Although multiple layers each of a high refractive index layer and low refractive index layer are present in the multilayer reflective film 2, the high refractive index layers and low refractive index layers are not required to have the same thickness. In addition, the film thickness of the Si layer of the uppermost side of the multilayer reflective film 2 can be adjusted within a range that does not cause a decrease in reflectance. Film thickness of the Si on the uppermost side (high refractive index layer) can be 3 nm to 10 nm.

Methods for forming the multilayer reflective film 2 are known in the art. For example, each layer of the multilayer reflective film 2 can be deposited by ion beam sputtering to form the multilayer reflective film 2. In the case of the aforementioned Mo/Si cyclically laminated film, an Si film having a film thickness of about 4 nm is first deposited on the substrate 1 by ion beam sputtering using an Si target, after which an Mo film having a film thickness of about 3 nm is deposited using an Mo target, when defining this procedure as constituting one cycle, followed by forming the multilayer reflective film 2 by laminating for 40 to 60 cycles (with the layer on the uppermost side being an Si layer). In addition, when depositing the multilayer reflective film 2, the multilayer reflective film 2 may have formed by ion beam sputtering by supplying krypton (Kr) ion particles from an ion source.

<<Protective Film>>

The protective film 3 is formed on the multilayer reflective film 2 in order to protect the multilayer reflective film 2 from dry etching and cleaning in the fabrication process of a reflective mask blank to be subsequently described. In addition, the protective film 3 also serves to protect the multilayer reflective film 2 when repairing opaque defects in a phase shift pattern using an electron beam (EB). Here, although FIG. 1 shows the case of the protective film 3 consisting of a single layer, the protective film 3 can also have a laminated structure consisting of not less than three layers. For example, the protective film 3 may use layers consisting of substances containing the aforementioned Ru for the lowermost layer and uppermost layer, and a metal or alloy other than Ru may be interposed between the lowermost layer and the uppermost layer. For example, the protective film 3 can be composed of a material containing ruthenium as the main component thereof. Namely, the material of the protective film 3 may be Ru metal alone or an Ru alloy containing Ru and at least one type of metal selected from, for example, titanium (Ti), niobium (Nb), molybdenum (Mo), zirconium (Zr), yttrium (Y), boron (B), lanthanum (La), cobalt (Co) or rhenium (Re), and nitrogen may also be contained. The case of the protective film 3 being such that a TaTi alloy-based material is used for the phase shift pattern 4 and the phase shift pattern 4 is patterned by dry etching with a Cl-based gas is particularly effective.

The content ratio of Ru in the Ru alloy is not less than 50% at % to less than 100 at %, may be not less than 80 at % to less than 100 at %, and more may be not less than 95 at % to less than 100 at %. In the case the content ratio of Ru in the Ru alloy is not less than 95 at % to less than 100 at % in particular, the protective film 3 can also be provided with resistance of the mask to cleaning, an etching stop function used when etching the phase shift film and a protective film function for preventing time-based changes in the multilayer reflective film, while suppressing diffusion of a constituent element of the multilayer reflective film (silicon) into the protective film 3 and adequately ensuring reflectance of EUV light.

In the case of EUV lithography, since there are few substances that are transparent with respect to exposure light, it is not technically easy to provide an EUV pellicle that prevents adhesion of foreign matter to the surface of the mask pattern. Thus, pellicle-less applications not employing a pellicle have become common. In addition, in the case of EUV lithography, exposure contamination occurs in the manner of deposition of a carbon film or growth of an oxide film on the mask caused by EUV exposure. Consequently, it is necessary to remove foreign matter and contamination on the mask by frequently carrying out cleaning at the stage an EUV reflective mask is used to manufacture a semiconductor device. Consequently, the EUV reflective mask is required to demonstrate considerably more resistance to mask cleaning in comparison with transmissive masks for photolithography. The use of a Ru-based protective film containing Ti makes it possible to particularly enhance cleaning resistance to cleaning solutions such as sulfuric acid, sulfuric peroxide mixture (SPM), ammonia, ammonia peroxide mixture (APM), OH radical cleaning solution or ozone water having a concentration of not more than 10 ppm, thereby satisfying the requirement of being resistant to mask cleaning.

There are no particular limitations on the thickness of this protective film 3 composed of Ru or an alloy thereof provided it allows the function of a protective film to be demonstrated. From the viewpoint of reflectance of EUV light, the thickness of the protective film 3 may be 1.0 nm to 8.0 nm and may be 1.5 nm to 6.0 nm.

A deposition method similar to known deposition methods can be used to form the protective film 3 without any particular restrictions. Specific examples thereof include sputtering and ion beam sputtering.

<<Phase Shift Film>>

The phase shift film 4 that shifts the phase of EUV light is formed on the protective film 3. In the portion where the phase shift pattern 4 is formed, EUV light through is absorbed and reduced, a portion of the light reflects at a level that does not have a detrimental effect, and a desired phase difference is formed with reflected light reflected from a field portion that is reflected from the multilayer reflective film 2 through the protective film 3. The phase shift pattern 4 is formed so that the phase difference between light reflected from the phase shift film 4 and light reflected from the multilayer reflective film 2 is from 160° to 200°. Image contrast of a projected optical image improves due to mutual interference at a pattern edge of light differing in phase as a result of being inverted by 180°. Resolution improves accompanying the improvement in image contrast resulting in a wider range for various types of tolerance relating to exposure such as exposure quantity tolerance or focus tolerance. Although varying according to the pattern and exposure conditions, a general indicator of reflectance of the phase shift film 4 for obtaining this phase shift effect is not less than 1% in terms of absolute reflectance and not less than 2% in terms of reflection ratio relative to the multilayer reflective film 2 (provided with the protective film). Reflectance of the phase shift film 4 in order to obtain an adequate phase shift effect may have not less than 2.5% in terms of absolute reflectance.

The material of the phase shift pattern 4 may have a TaTi-based material containing tantalum (Ta) and titanium (Ti). Examples of the TaTi-based material include TaTi alloys and TaTi compounds containing at least one of oxygen, nitrogen, carbon and born in the TaTi alloy. Examples of TaTi compounds that can be applied for the TaTi compound include TaTiN, TaTiO, TaTiON, TaTiCON, TaTiB, TaTiBN, TaTiBO, TaTiBON and TaTiBCON.

Since Ta is highly resistant to cleaning with sulfuric acid or sulfuric peroxide mixture (SPM) and the like and has favorable processability that enables it to be easily dry etched with fluorine-based gas and chlorine-based gas, it is superior as a material of the phase shift film 4. The refractive index (n) of Ta is 0.943 and the extinction coefficient (k) is 0.041. Consequently, in order to obtain an adequate phase shift effect with a thin film, materials combined with Ta are required be materials having a smaller extinction coefficient (k) or smaller refractive index (n) than Ta. Since Ti has a smaller extinction coefficient in comparison with Ta, reflectance can be obtained that is sufficient for obtaining a phase shift effect. In addition, since the refractive index (n) of TiN is 0.932 and the extinction coefficient (k) is 0.020, thereby having a smaller refractive index and extinction coefficient in comparison with Ta, a thin film combining Ta and Ti allows the obtaining of desired phase difference and reflectance.

Figure 3:
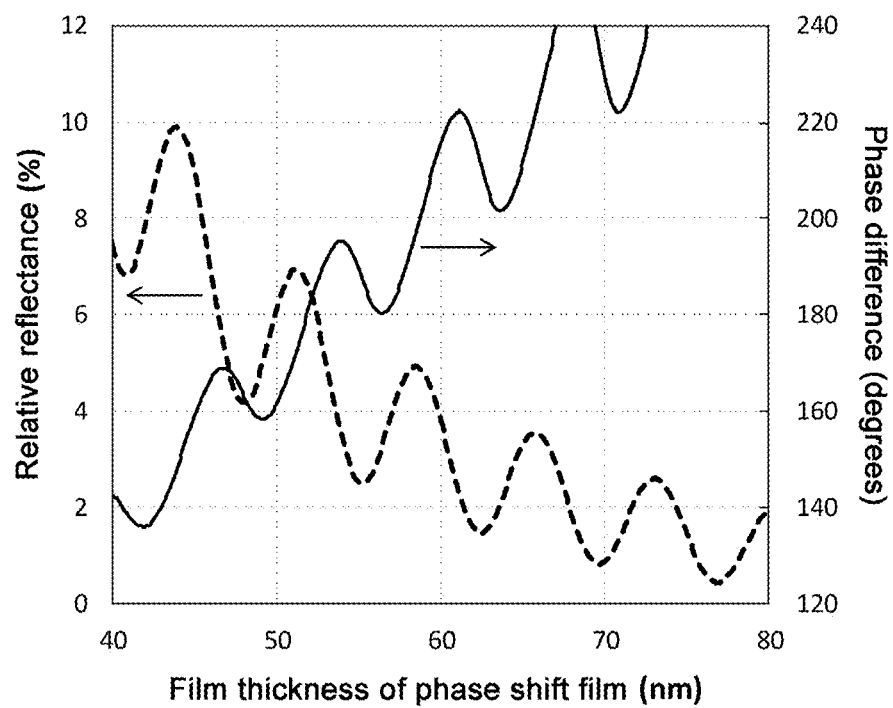
FIG. 3 is a graph indicating the relationship between the thickness of a phase shift film and relative reflectance and phase difference with respect to light having a wavelength of 13.5 nm.

For example, the refractive index n of a TaTiN film at 13.5 nm is about 0.937 while the extinction coefficient k is about 0.030. The phase shift film 4 can be set to a film thickness that yields desired values for reflectance and phase difference, and film thickness can be set to less than 60 nm and may be not more than 50 nm. As shown in FIG. 3, in the case of having formed the phase shift film 4 with a TaTiN film, relative reflectance with respect to the multilayer reflective film (with protective film) is 5.4% and phase difference is about 169° at a film thickness of 46.7 nm, while relative reflectance with respect to the multilayer reflective film (with protective film) is 6.6% and phase difference is about 180° at a film thickness of 51.9 nm. Furthermore, relative reflectance refers to reflectance of the phase shift film to EUV light when based on absolute reflectance in the case of EUV light having been reflected after directly entering the multilayer reflective film (with protective film).

In addition, the TaTi-based material is a material that can be dry etched with chlorine (Cl)-based gas substantially free of oxygen. As was previously described, an example of a material that allows the obtaining of a phase shift effect is Ru. Since Ru has a low etching rate and is difficult to process and repair, problems with processability may occur in the case of having formed the phase shift film with a material containing TaRu.

The ratio of Ta to Ti in the TaTi-based material may be 4:1 to 1:4. In addition, in the case of containing nitrogen, the ratio of Ta to TiN may be 4:1 to 1:9.

This phase shift film 4 composed of a TaTi-based material can be formed with a known method in the manner a magnetron sputtering method such as DC sputtering or RF sputtering. In addition, a TaTi alloy may be used for the target, or co-sputtering can be employed using a Ta target and Ti target.

The phase shift film 4 may consist of a single layer or may be a multilayer film composed of a plurality of not less than two layers. In the case the absorber film 4 is a single layer film, the phase shift film 4 is characterized by improved production efficiency since the number of processes during mask blank fabrication can be reduced. Furthermore, in the case the phase shift film is a single layer film such as a TaTiN film that is substantially free of oxygen, a natural oxide film is formed on the surface layer as a result of the phase shift film being exposed to the atmosphere following deposition. In this case, the natural oxide film may be removed with a fluorine-based gas followed by etching with a chlorine-based gas in the same manner as etching a phase shift film composed of a two-layer structure to be subsequently described.

In the case the phase shift film 4 is a multilayer film, a laminated structure can be employed in which not less than 3 layers of a first material layer and a second material layer are alternately laminated. The first material layer is selected from Ta and TaB, and the second material layer can be selected from TiN, TiO, TiON and TiCON. Adjusting the film thicknesses of the first material layer and second material layer makes it possible to improve the stability of phase difference and reflectance with respect to fluctuations in film thickness. In addition, making the uppermost layer of the phase shift film 4 to be the first material layer makes it possible to improve cleaning resistance.

Figure 4:
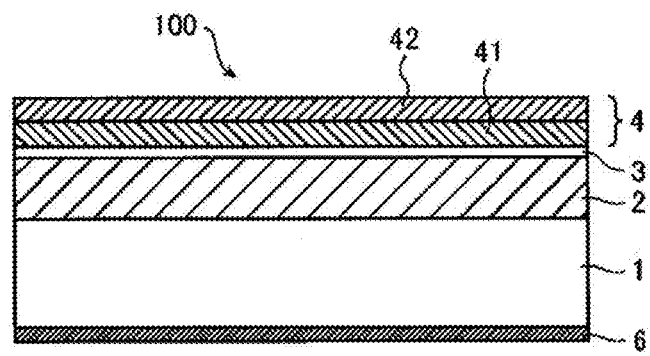
FIG. 4 is a cross-sectional schematic diagram of main portions for explaining the general configuration of a reflective mask blank according to the present disclosure.

In the case the phase shift film 4 is a multilayer film, as shown in FIG. 4, for example, a two-layer structure can be employed that is composed of a lower layer film 41 and an upper layer film 42 as viewed from the substrate side. The lower layer film 41 consists of a material layer containing tantalum (Ta), titanium (Ti) and nitrogen (N) that has a large extinction coefficient for EUV light and demonstrates high etching processability. The upper layer film 42 consists of a material layer containing tantalum (Ta), titanium (Ti) and oxygen (O). The optical constants and film thickness of the upper layer film 42 are suitably set so that the upper layer film serves as an antireflective film during mask pattern inspections using DUV light, for example. As a result, inspection sensitivity when inspecting the mask pattern using DUV light is improved. In addition, the upper layer film 42 also functions as an anti-oxidation film in the case the lower layer film 41 does not substantially contain oxygen such as in the case of a TaTiN film.

In addition, since EUV light has a short wavelength, phase difference and reflectance tend to be largely dependent on film thickness. Thus, the phase shift film 4 is required to demonstrate stable phase difference and reflectance with respect to fluctuations in film thickness. However, as shown in FIG. 3, phase difference and reflectance exhibit various oscillatory structures in response to the film thickness of the phase shift film 4. Since the oscillatory structures of phase difference and reflectance differ, it is difficult to obtain a film thickness that simultaneously stabilizes phase difference and reflectance.

Therefore, even in the case the film thickness of the phase shift film 4 has fluctuated somewhat from the design value (such as within a range of ±0.5% relative to the design film thickness), variations in phase difference, such as interplanar phase difference, are desired to be within the range of 180°±2° and reflectance, such as interplanar reflectance, is desired to be within the range of 6%±0.2%.

Oscillatory structures can be smoothened and phase difference and reflectance that are stable with respect to fluctuations in film thickness can be obtained by inhibiting EUV light reflected from the uppermost surface of the upper layer film 42. The material of this upper layer film 42 may be a material in which the refractive index is larger than the refractive index of the lower layer film 41 in EUV light and smaller than the refractive index of the outside world (n=1). In addition, the film thickness of the upper layer film may be about ¼ the cycle of the wavelength. In the case the lower film layer 41 is composed of a material containing tantalum (Ta) and titanium (Ti), the material of the upper layer film 42 may be a silicon compound. Examples of silicon compounds include materials containing Si and at least one element selected from N, O, C and H, and examples include $SiO_2$, SiON and $Si_3N_4$. The upper layer film 42 can be, for example, a $SiO_2$ film in the case the lower layer film 41 is a TaTiN film.

In this manner, various functions can be imparted to each layer by using a multilayer film for the phase shift film 4.

In the case the phase shift film 4 employs a two-layer structure as previously described, a gas selected from a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$ or $F_2$, and mixed gases containing these fluorine-based gases and $O_2$ at a prescribed ratio, can be used for the etching gas of the upper layer film 42. In addition, a gas selected from a chlorine-based gas such as $Cl_2$, $SiCl_4$ and $CHCl_3$, a mixed gas containing a chlorine-based gas and $O_2$ at a prescribed ratio, a mixed gas containing a chlorine-based gas and He at a prescribed ratio, and a mixed gas containing a chlorine-based gas and Ar at a prescribed ratio can be used for the etching gas of the lower layer film 41. Here, if oxygen is contained in the etching as at the final stage of etching, surface roughening occurs in the Ru-based protective film 3. Consequently, an etching gas not containing oxygen may be used in the over-etching stage when the Ru-based protective film 3 is exposed to etching.

An etching mask film may also be formed on the phase shift film 4. A material for which the phase shift film 4 has high etching selectivity for the etching mask film is used for the material of the etching mask film. Here, "etching selectivity of B for A" refers to the ratio of the etching rates of the layer on which etching is desired to be carried out in the form of B to the layer where etching is not carried out (layer serving as mask) in the form of A. More specifically, etching selectivity is specified with the equation "etching selectivity of B to A=etching rate of B/etching rate of A". In addition, "high selectivity" refers to the value of selectivity as defined above being large relative to a comparison target. Etching selectivity of the phase shift film 4 to the etching mask film may be not less than 1.5 and may be not less than 3.

A material composed of chromium or a chromium compound can be used for the material for which the phase shift film 4 has high etching selectivity for the etching mask film in the case the phase shift film 4 (or upper layer film 42) is etched with a fluorine-based gas. Examples of chromium compounds include materials containing Cr and at least one element selected from N, O, C and H. In addition, in the case of etching the phase shift film 4 (or upper layer film 42) with a chlorine-based gas substantially free of oxygen, a material containing silicon or a silicon compound can be used. Examples of silicon compounds include materials containing Si and at least one element selected from N, O, C and H, and materials such as metallic silicon (metal silicides) containing a metal in silicon or a silicon compound. Examples of metal silicon compounds include materials containing a metal, Si and at least one element selected from N, O, C and H.

The film thickness of the etching mask film may be not less than 3 nm from the viewpoint of obtaining the function of an etching mask of being able to accurately form a transfer pattern of the phase shift film 4. In addition, the film thickness of the etching mask film may be not more than 15 nm from the viewpoint of reducing film thickness of the resist film.

<<Back Side Conductive Film>>

The back side conductive film 5 for electrostatic chucking is typically formed on the side of the second main surface (back side) of the substrate 1 (opposite side of the side on which the multilayer reflective film 2 is formed). The back side conductive film 5 for electrostatic chucking is normally required to demonstrate an electrical property (sheet resistance) of not more than 100Ω/□ (Ω/square). The back side conductive film 5 can be formed by example, magnetron sputtering or ion beam sputtering, using targets consisting of a metal such as chromium or tantalum and an alloy.

A material containing chromium (Cr) of the back side conductive film 5 may be a Cr compound containing Cr and at least one element selected from boron, nitrogen, oxygen and carbon. Examples of Cr compounds include CrN, CrON, CrCN, CrCON, CrBN, CrBON, CrBCN and CrBOCN.

Tantalum (Ta), alloy containing Ta or Ta compound containing any of these and at least one element selected from boron, nitrogen, oxygen and carbon may be used for the material containing tantalum (Ta) of the back side conductive film 5. Examples of Ta compounds include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON.

Materials containing tantalum (Ta) or chromium (Cr) may have little nitrogen (N) present on the surface thereof. More specifically, the content of nitrogen of a material containing tantalum (Ta) or chromium (Cr) of the surface layer of the back side conductive film 5 may be less than 5 at %, and the surface layer may be substantially free of nitrogen. This is because, in the back side conductive layer of a material containing tantalum (Ta) or chromium (Cr), a lower nitrogen content of the surface layer results in increased wear resistance.

The back side conductive film 5 may be composed of a material containing tantalum and boron. As a result of the back side conductive film 5 being composed of a material containing tantalum and boron, the back side conductive film 5 can be obtained having wear resistance and chemical resistance. In the case the back side conductive film 5 contains tantalum (Ta) and boron (B), the B content may be 5 at % to 30 at %. The ratio of Ta to B (Ta:B) in the sputtering target used to deposit the back side conductive film 5 may be 95:5 to 70:30.

Although there are no particular limitations on the thickness of the back side conductive film 5 provided it satisfies the function of being used for electrostatic chucking, it is normally from 10 nm to 200 nm. In addition, this back side conductive film 5 is also provided with the function of adjusting stress on the side of the second main surface of the mask blank 100, and is adjusted so as to obtain a flat reflective mask blank by achieving balance with the stress from each type of film formed on the side of the first main surface.

In addition, as is described in Japanese Patent No. 5883249 B, there is a technology in which, in order to correct an error such as error in the positioning of a reflective mask or other transfer mask, the surface or interior of the substrate is modified resulting in correction of error in the transfer mask by locally irradiating the substrate of the transfer mask with femtosecond laser pulses. Examples of lasers used to generate the aforementioned pulses include sapphire lasers (wavelength: 800 nm) and Nd-YAG lasers (532 nm).

When applying the aforementioned technology to a reflective mask 200, the laser beam is thought to be radiated from the side of the second main surface (back side) of the substrate 1. However, in the case of the aforementioned back side conductive film 5 composed of a material containing tantalum (Ta) or chromium (Cr), the problem occurs of difficulty of the laser in passing through this film. In order to solve this problem, the back side conductive film 5 may be formed at least using a material in which transmittance of light having a wavelength of 532 nm is not less than 20%.

Indium tin oxide (ITO), fluorine-doped tin oxide (FTO), aluminum-doped zinc oxide (AZO) or antimony-doped tin oxide (ATO) may be used for the material this back side conductive film (transparent conductive film) 5 having high transmittance. Making the film thickness of the transparent conductive film to be not less than 50 nm enables the electrical property (sheet resistance) required of the back side conductive film 5 for electrostatic chucking to be not more than 100Ω/□. For example, the transmittance of an ITO film having a film thickness of 100 nm for a wavelength of 532 nm is about 79.1% and sheet resistance of 50 Ω/□.

In addition, a metal such as platinum (Pt), gold (Au), aluminum (Al) or copper (Cu) may be used as a material of the back side conductive film (transparent conductive film) 5 having high transmittance. In addition, a metal compound containing these metals and at least one of boron, nitrogen, oxygen and carbon can also be used within a range that satisfies the desired transmittance and electrical properties. These metal films make it possible to reduce film thickness in comparison with the aforementioned ITO and the like due to the high electrical conductivity thereof. The film thickness of the metal film may be not more than 50 nm and may be not more than 20 nm from the viewpoint of transmittance. In addition, if the film is excessively thin, since sheet resistance tends to increase rapidly, and from the viewpoint of stability during deposition, the film thickness of the metal film may be not less than 2 nm. The transmittance of a Pt film having a film thickness of 10.1 nm with respect to a wavelength of 532 nm is 20.3% and sheet resistance is 25.3 Ω/□.

Moreover, the back side conductive film 5 may be a single layer film or have a multilayer structure of not less than 2 layers. In order to improve mechanical durability during electrostatic chucking or improve cleaning resistance, the uppermost layer may consist of CrO, TaO or $SiO_2$. In addition, the uppermost layer may consist of an oxide film of the aforementioned metal films, namely PtO, AuO, AlO or CuO. The thickness of the uppermost layer may be not less than 1 nm, not less than 5 nm and even not less than 10 nm. In the case of the back side conductive film being in the form of a transparent conductive film, the material and film thickness satisfy transmittance of not less than 20%.

In addition, an intermediate layer may be provided on the substrate side of the back side conductive film 5. The intermediate layer can be given a function that improves adhesion between the substrate 1 and the back side conductive film 5 or inhibits the entry of hydrogen from the substrate 1 into the back side conductive film 5. In addition, the intermediate layer can be given a function that inhibits vacuum ultraviolet light and ultraviolet light (wavelength: 130 nm to 400 nm) referred to as out-of-band light from penetrating the substrate 1 and being reflected by the back side conductive film 5 in the case of using EUV light for the exposure light source. Examples of materials of the intermediate layer include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO and TaON. The thickness of the intermediate layer may be not less than 1 nm, not less than 5 nm, and even not less than 10 nm. In the case the back side conductive film is in the form of a transparent conductive film, the material and film thickness satisfy a transmittance of a laminate of the intermediate layer and transparent conductive substrate of not less than 20%.

As was previously described, although the back side conductive film 5 is required to have desired values for an electrical property (sheet resistance) and transmittance in the case of radiating a laser beam from the back side, when the film thickness of the back side conductive film 5 is reduced in order to satisfy these requirements, different problems occur. Normally, since the multilayer reflective film 2 has high compressive stress, projections form on the first main surface of the substrate 1 while indentations form on the second main surface (back side). On the other hand, stress is adjusted by annealing (heat treatment) of the multilayer reflective film 2 and deposition of the back side conductive film 5, and is adjusted so as to obtain a reflective mask blank that is flat overall or has only slight depressions in the second main surface. However, this balance is disrupted if the film thickness of the back side conductive film 5 is excessively thin thereby causing indentations in the second main surface to end up becoming excessively large. In this case, scratches form in the periphery of the substrate (and particular in the corners) during electrostatic chucking and problems such as film separation or particle generation may occur.

In order to solve these problems, the second main surface (back side) of the substrate with conductive film on which the back side conductive film 5 is formed may have a convex shape. A first method for giving the second main surface (back side) of the substrate with conductive film consists of giving the second main surface of the substrate 1 a convex shaped prior to depositing the back side conductive film 5. As a result of preliminarily giving the second main surface of the substrate 1 a convex shape, the shape of the second main surface can be made to be convex even if the back side conductive film 5, composed of, for example, a Pt film having a film thickness of about 10 nm and having small compressive stress, is deposited and a multilayer reflective film 2 having high compressive stress is deposited.

In addition, a second method for giving the second main surface (back side) of the substrate with conductive film a convex shape consists of annealing (heat treating) at 150° C. to 300° C. after depositing the multilayer reflective film 2. Annealing may be carried out at a high temperature of not lower than 210° C. Although annealing the multilayer reflective film 2 makes it possible to decrease film stress of the multilayer reflective film, there is a tradeoff between annealing temperature and reflectance of the multilayer reflective film. When depositing the multilayer reflective film 2, in the case of conventional Ar sputtering in which argon (Ar) ion particles are supplied from an ion source, the desired reflectance is not obtained if annealing is carried out at a high temperature. On the other hand, as a result of carrying out Kr sputtering in which krypton (Kr) ion particles are supplied from an ion source, annealing resistance of the multilayer reflective film 2 can be improved and high reflectance can be maintained if annealed at a high temperature. Thus, as a result of annealing at 150° C. to 300° C. after depositing the multilayer reflective film 2 by Kr sputtering, film stress of the multilayer reflective film 2 can be decreased. In this case, even if the back side conductive film 5 composed of, for example, a Pt film having a film thickness of about 10 nm and having low film stress, is deposited, the shape of the second main surface can be made to have a convex shape.

Moreover, the aforementioned first method and second method may also be combined. Furthermore, film thickness can be thickened in the case of using a transparent conductive film such as an ITO film for the back side conductive film. Consequently, the second main surface (back side) of the substrate with conductive film can be given a convex shape by thickening thickness within a range that satisfies electrical properties.

As a result of giving the second main surface (back side) of the substrate with conductive film a convex shape in this manner, the formation of scratches in the periphery of the substrate (and particularly, the corners) can be prevented during electrostatic chucking.

<Reflective Mask and Fabrication Method Thereof>

A reflective mask is fabricated using the reflective mask blank 100 of the present embodiment. The following provides only a general explanation, while a detailed explanation is subsequently provided in the examples with reference to the drawings.

The reflective mask blank 100 is prepared, a resist film is formed on the phase shift film 4 of the first main surface thereof (not required in the case a resist film is provided in the reflective mask blank 100), and a desired pattern is drawn (exposed) on this resist film followed by development and rinsing to form a prescribed resist pattern.

In the case of the reflective mask blank 100, a phase shift pattern is formed by forming a phase shift pattern by etching the phase shift film 4 by using this resist pattern as a mask, and then removing the resist pattern by ashing or with a resist stripping solution. Finally, wet cleaning is carried out using an acidic or alkaline aqueous solution.

Here, a chlorine-based gas such as $Cl_2$, $SiCl_4$, $CHCl_3$ or $CCl_4$, a mixed gas containing a chlorine-based gas and He at a prescribed ratio, or a mixed gas containing a chlorine-based gas and Ar at a prescribed ratio is used for the etching gas of the phase shift film 4. Since the etching gas is substantially free of oxygen during etching of the phase shift film 4, there is no occurrence of surface roughening of the Ru-based protective film. This gas that is substantially free of oxygen corresponds to an oxygen content in the gas of not more than 5 at %.

According to the aforementioned process, a reflective mask is obtained that exhibits little shadowing effects and has a highly accurate and fine pattern exhibiting little side wall roughness.

<Method of Manufacturing Semiconductor Device>

A desired transfer pattern based on a phase shift pattern on the reflective mask 200 is formed on a semiconductor substrate by carrying out EUV exposure using the reflective mask 200 of the aforementioned present embodiment while suppressing decreases in transfer dimensional accuracy caused by shadowing effects. In addition, since the phase shift pattern constitutes a fine and highly accurate pattern with little sidewall roughness, a desired pattern can be formed on a semiconductor substrate with high dimensional accuracy. A semiconductor device having a desired electronic circuit formed thereon can be manufactured with this lithography in addition to various other processes such as etching of the processed film, formation of an insulating film and conductive film, introduction of dopant or annealing.

In providing a more detailed explanation, the EUV exposure apparatus is composed of components such as a laser plasma light source that generates EUV light, illumination optical system, mask stage system, reduction projection optical system, wafer stage system and vacuum equipment. The light source is provided with components such as a debris entrapment function, a cutoff filter that cuts out light of a long wavelength other than exposure light, and equipment for vacuum differential evacuation. The illumination optical system and reduction projection optical system are composed of reflective mirrors. The reflective mask 200 for EUV exposure is placed on the mask stage by being electrostatically chucked by the back side conductive film 5 formed on the second main surface thereof.

EUV exposure light is radiated onto the reflective mask 200 via the illumination optical system at an angle inclined from 6° to 8° to the perpendicular plane of the reflective mask. Light reflected from the reflective mask 200 in response to this incident light is guided to the reflective projection optical system in the opposite direction from the incident light, inverted at the same angle as the incident light (specular reflection), and normally at a reduction ratio of ¼, after which the resist on a wafer (semiconductor substrate) placed on the wafer stage is subjected to exposure. During this time, a vacuum is drawn at least at those locations through which EUV light passes. In addition, this exposure primarily employs scan exposure in which exposure is carried out through a slit by synchronizing and scanning the mask stage and wafer stage at a speed corresponding to the reduction ratio of the reduction projection optical system. A resist pattern can then be formed on a semiconductor substrate by developing this exposed resist film. A mask in the form of a thin film exhibiting little shadowing effects that also has a highly accurate phase shift pattern having little sidewall roughness is used in the present disclosure. Consequently, a resist pattern formed on the semiconductor substrate is a desired resist pattern having high dimensional accuracy. As a result of carrying out etching and the like by using this resist pattern as a mask, a prescribed wiring pattern, for example, can be formed on a semiconductor substrate. A semiconductor device is manufactured by going through this type of exposure process, processed film processing process, insulating film and conductive film formation process, dopant introduction process or annealing process and the like.

EXAMPLES

The following provides an explanation of examples with reference to the drawings. Furthermore, the same reference symbols are used to indicate similar constituents in the examples, and explanations thereof may be simplified or omitted.

Example 1

FIGS. 2(a)-3(d) are cross-sectional schematic diagrams of main portions indicating a process for fabricating the reflective mask 200 from the reflective mask blank 100.

Figure 2A:
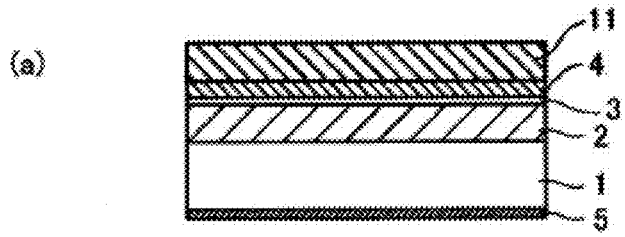
FIGS. 2(a)-2(d) are process drawings indicating a process for fabricating a reflective mask from a reflective mask blank with a cross-sectional schematic diagram of the main portions thereof.
Figure 2B:
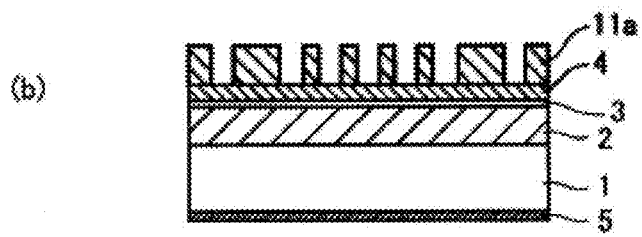
Figure 2C:
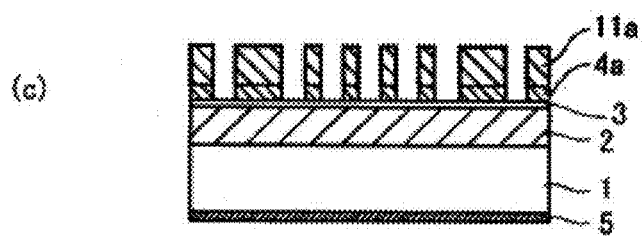
Figure 2D:
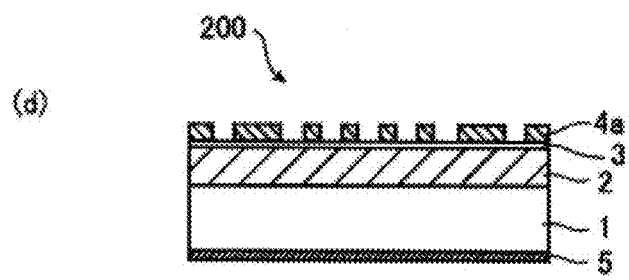

The reflective mask blank 100 has the back side conductive film 5, the substrate 1, the multilayer reflective film 2, the protective film 3 and the phase shift film 4. The phase shift film 4 is composed of a material containing a TaTi alloy. As shown in FIG. 2(a), a resist film 11 is formed on the phase shift film 4.

First, an explanation is provided of the reflective mask blank 100.

A 6025 size (approx. 152 mm×152 mm×6.35 mm) low thermal expansion substrate in the form of an $SiO_2$-$TiO_2$-based glass substrate, of which both the first main surface and second main surface has been polished, is prepared as the substrate 1. Polishing consisting of a coarse polishing process, precision polishing process, local processing process and touch polishing process was carried out so as to obtain flat and smooth main surfaces.

The back side conductive film 5 composed of a CrN film was formed on the second main surface (back side) of the $SiO_2$-$TiO_2$-based glass substrate 1 by magnetron sputtering (reactive sputtering).

Back side conductive film formation conditions: Cr target, mixed gas atmosphere of Ar and $N_2$ (Ar: 90%, $N_2$: 10%), film thickness: 20 nm Next, the multilayer reflective film 2 was formed on the main surface (first main surface) of the substrate 1 on the opposite side from the side on which the back side conductive film 5 was formed. The multilayer reflective film 2 formed on the substrate 1 was a cyclical multilayer reflective film consisting of Mo and Si in order to obtain a multilayer reflective film suitable for EUV light at a wavelength of 13.5 nm. The multilayer reflective film 2 was formed by using an Mo target and Si target and alternately laminating Mo layers and Si layers on the substrate 1 by ion beam sputtering in an Ar gas atmosphere. First, an Si film was deposited at a thickness of 4.2 nm followed by depositing an Mo film at a thickness of 2.8 nm. When the deposition of these films is taken to be one cycle, the films were similarly deposited for 40 cycles. Finally, an Si film was deposited at a thickness of 4.0 nm to form the multilayer reflective film 2. Although the films were deposited for 40 cycles here, the number of cycles is not limited thereto, but rather the films may be deposited for, for example, 60 cycles. In the case of depositing for 60 cycles, although the number of processes increases more than in the case of 40 cycles, this enables reflectance to EUV light to be enhanced.

Continuing, the protective film 3 composed of an Ru film was deposited at a thickness of 2.5 nm by ion beam sputtering using an Ru target in Ar gas atmosphere.

Next, the phase shift film 4 composed of a TaTiN film was formed by DC magnetron sputtering. The TaTiN film was deposited at a film thickness of 51.9 nm by reactive sputtering using a TaTi target in a mixed gas atmosphere of Ar gas and $N_2$ gas. The content ratio of the TaTiN film was Ta:Ti:N=1:1:1.

The refractive index n and extinction coefficient (refractive index imaginary component) k of the TaTiN film formed as described above at a wavelength of 13.5 nm were each as indicated below.

TaTiN: n=0.937, k=0.030

Furthermore, an ultrathin natural oxide film (TaTiON film) was formed on the surface layer of the phase shift film without having an effect on phase shift effect.

The absolute reflectance of the aforementioned phase shift film 4 composed of the TaTiN film at a wavelength of 13.5 nm was 4.3% (equivalent to 6.6% for the reflectance to the surface of the multilayer reflective film with a protective film). In addition, the film thickness of the phase shift film 4 was 51.9 nm and the phase difference when patterning the phase shift film was a film thickness corresponding to 180°. Thus, film thickness was able to be reduced by about 20% from the 65 nm for the film thickness of the phase shift film composed of a TaN film in the comparative example to be subsequently described, thereby making it possible to reduce shadowing effects. This reduction in shadowing effects is described in detail in the section entitled "Manufacturing of Semiconductor Device".

Next, the reflective mask 200 was fabricated using the aforementioned reflective mask blank 100.

As was previously described, the resist film 11 was formed at a thickness of 100 nm on the phase shift film 4 of the reflective mask blank 100 (FIG. 2(a)). A desired pattern was drawn (exposed) on this resist film 11 followed by developing and rinsing to form a prescribed resist pattern 11a (FIG. 2(b)). Next, using the resist pattern 11a as a mask, the surface layer (natural oxide film) of the phase shift film 4 was removed by dry etching using $CF_4$ gas followed by dry etching the TaTiN film (phase shift film 4) using $Cl_2$ gas to form a phase shift pattern 4a (FIG. 2(c)).

Subsequently, the resist pattern 11a was removed by ashing or with a resist stripping solution. Finally, it was subjected to wet cleaning with pure water (DIW) to fabricate the reflective mask 200 (FIG. 2(d)). Furthermore, the mask can be inspected for defects as necessary following wet cleaning followed by suitably correcting any mask defects.

In the reflective mask 200 of Example 1, since the phase shift film 4 consists of a TaTi alloy-based material, processability in chlorine-based gas was favorable and the phase shift pattern 4a was able to be formed with high accuracy. In addition, the film thickness of the phase shift pattern 4a is 51.9 nm and the thickness thereof was able to be reduced to a thickness that is less than the thickness of a conventional absorber film formed with a Ta-based material, thereby making it possible to reduce shadowing effects.

Figure 5A:
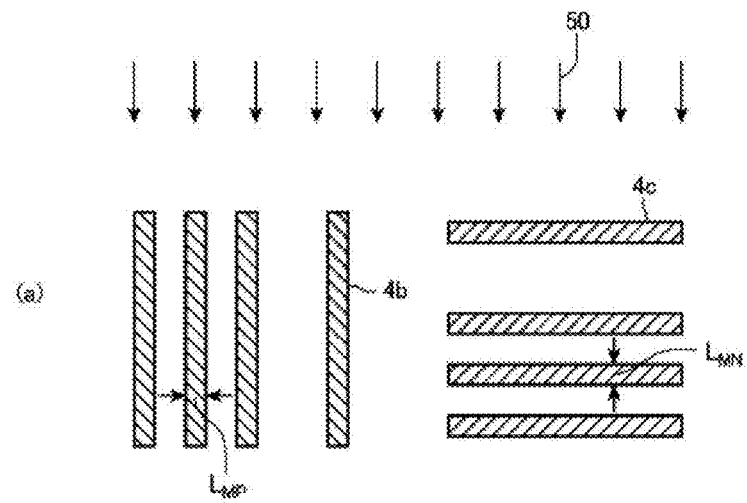
Figure 5B:
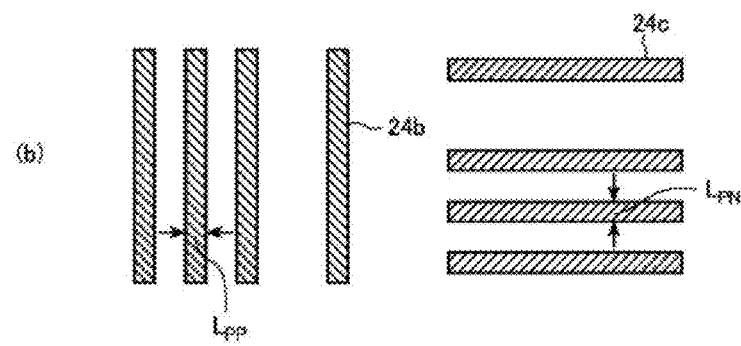

The reflective mask 200 fabricated in Example 1 was placed in a EUV scanner followed by exposing a wafer, in which the processed film and resist film are formed on a semiconductor substrate, to EUV light. By then developing this exposed resist film, a resist pattern was formed on the semiconductor substrate having the processed film formed thereon. In order to evaluate shadowing effects during this exposure, a pattern disposed in parallel with exposure light entering the mask and a pattern disposed perpendicular thereto were used followed by measurement of the difference in transfer dimensions there between. FIG. 5(a) is an overhead view of the phase shift patterns disposed on the mask indicating a phase shift pattern 4b disposed facing parallel with incident exposure light 50 and a phase shift pattern 4c disposed facing perpendicular thereto. The phase shift patterns 4b and 4c have the same shape with the exception of the direction in which they are disposed, and thus, line width LMP of the phase shift pattern 4b has the same line width as line width LMN of the phase shift pattern 4c. The exposure light 50 enters the mask at an angle inclined by 6° relative to the normal direction of the mask surface. FIG. 5(b) indicates an overhead view of a resist pattern formed on a wafer by exposure and development. A resist pattern 24b and a resist pattern 24c were formed by transfer from the phase shift patterns 4b and 4c, respectively. The difference ΔL (=LPN−LPP) between line widths LPP and LPN of the transferred and formed resist patterns serve as an indicator of shadowing effects. In general, this difference is referred to as the dimension XY difference attributable to shadowing effects, and due to the shadow of exposure light formed as a result of the phase shift patterns acting as a wall, line width LPN is thicker than line width LPP in the case of using a positive resist.

In the case of the reflective phase shift mask fabricated in Example 1, the dimension XY difference ΔL was 2.0 nm. Although again described in the section describing a comparative example, in the case of using a single-layer phase shift film composed of TaN having a film thickness of 65 nm, this dimension XY difference ΔL was 2.6 nm, thereby demonstrating that the use of reflective phase shift mask fabricated in Example 1 makes it possible to improve decreases in transfer accuracy attributable to shadowing effect by not less than 20%. In addition, since the reflective phase shift mask fabricated in Example 1 has little sidewall roughness of the phase shift pattern and has a stable cross-sectional shape, there is little variation in LER and dimensional in-plane variation of the resist pattern following transfer and formation while also retaining high transfer accuracy. In addition, as was previously described, since the absolute reflectance of the phase shift surface is 4.3% (reflectance of 6.6% with respect to surface of multilayer reflective film with a protective film), adequate phase shift effects were able to be obtained and EUV exposure having high exposure tolerance and focus tolerance can be carried out.

A semiconductor device having desired properties can be manufactured by transferring this resist pattern to a processed film by etching and then going through various processes such as formation of an insulating film and conductive film, introduction of dopant and annealing.

Example 2

Example 2 is an example of the case of using a Pt film instead of a CrN film for the back side conductive film 5, and other conditions are the same as Example 1.

Namely, the back side conductive film 5 composed of a Pt film was respectively deposited at film thicknesses of 5.2 nm, 10.1 nm, 15.2 nm and 20.0 nm on the second main surface (back side) of the $SiO_2$—$TiO_2$-based glass substrate 1 by DC magnetron sputtering using a Pt target in an Ar gas atmosphere to fabricate four substrates with a conductive film.

Figure 6:
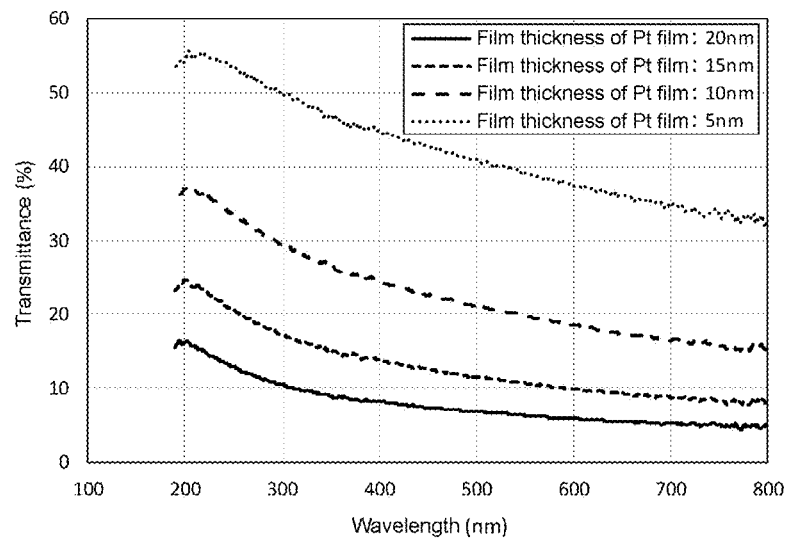
FIG. 6 is a graph indicating the transmittance spectrum of each film thickness of a back side conductive film composed of a Pt film.

The second main surfaces (back sides) of the fabricated four substrates with back side conductive film were irradiated with light of a wavelength of 532 nm, measurement of their transmittance values yielded values of 39.8%, 20.3%, 10.9% and 6.5%, respectively, as shown in FIG. 6, and those substrates with conductive film having film thicknesses of 5.2 nm and 10.1 nm satisfied the requirement of transmittance of not less than 20%. In addition, measurement of sheet resistance according to the four terminal method yielded values of 57.8 Ω/□, 25.3 Ω/□, 15.5Ω/□ and 11.2Ω/□, respectively, with each of these values satisfying the requirement of sheet resistance of not more than 100 Ω/□.

The reflective mask blank 100 was fabricated using the same method as Example 1 for the substrate with a conductive film having a film thickness of 10.1 nm followed by the fabrication of the reflective mask 200. When the fabricated reflective mask 200 was irradiated from the side of the second main surface (back side) of the substrate 1 thereof with a laser beam from a Nd-YAG laser having a wavelength of 532 nm, since the back side conductive film 5 was formed with a Pt film having high transmittance, positioning error of the reflective mask 200 was able to be corrected.

Example 3

Example 3 is an example of the case of having formed the phase shift film 4 with a multilayer film consisting of a TiN film and Ta film, and other conditions are the same as Example 1.

A TiN film was formed on the protective film 3 by DC magnetron sputtering. The TiN film was deposited at a film thickness of 0.7 nm by reactive sputtering using a Ti target in a mixed gas atmosphere of Ar gas and $N_2$ gas. Next, a Ta film was formed on the TiN film by DC magnetron sputtering. The Ta film was deposited at a film thickness of 1.6 nm by sputtering using a Ta target in an Ar gas atmosphere. The TiN film and Ta film were alternately deposited for 25 cycles and a Ta film was formed on the uppermost layer at a film thickness of 2.4 nm resulting in a film thickness of the multilayer film of 58.3 nm. The content ratio of each element in the multilayer film was Ta:Ti:N=7:3:6.

The refractive index n and extinction coefficient (refractive index imaginary component) k of the Ta/TiN multilayer film formed as described above at a wavelength of 13.5 nm were each as indicated below.

Ta/TiN multilayer film: n=0.943, k=0.028

Relative transmittance of the phase shift film 4 composed of the aforementioned multilayer film at a wavelength of 13.5 nm was 6.3% and phase difference was 180 degrees.

The reflective mask 200 was fabricated in the same manner as Example 1 using the aforementioned reflective mask blank 100. However, a process for removing the natural oxide film using $CF_4$ gas was not carried out since the uppermost layer of the phase shift film 4 in Example 3 is a Ta film.

In the reflective mask 200 of Example 3, since the phase shift film 4 is a Ta/TiN multilayer film, processability with chlorine-based gas is favorable and the phase shift pattern 4a can be formed with high accuracy. In addition, since the film thickness of the phase shift pattern 4a is 58.3 nm, film thickness was able to be reduced by about 10% from the 65 nm for the film thickness of the phase shift film composed of a TaN film in the comparative example to be subsequently described, thereby making it possible to reduce shadowing effects.

The reflective mask 200 fabricated in Example 3 was placed in a EUV exposure apparatus followed by exposing a wafer, in which a processed film and resist film were formed on a semiconductor substrate, to EUV light. By then developing this exposed resist film, a resist pattern was formed on the semiconductor substrate having the processed film formed thereon.

A semiconductor device having desired properties was able to be manufactured by transferring this resist pattern to a processed film by etching and then going through various processes such as formation of an insulating film and conductive film, introduction of dopant and annealing.

Example 4

Example 4 is an example of the case of having fabricated the phase shift film 4 in the form of a two-layer structure consisting of the upper layer film 41 and the lower layer film 42, and other conditions are the same as Example 1.

The lower layer film 41 composed of a TaTiN film was formed on the protective film 3 by DC magnetron sputtering. The TaTiN film was deposited at a film thickness of 45.1 nm by reactive sputtering using a TaTi target in a mixed gas atmosphere of Ar gas and $N_2$ gas. The content ratio of the TaTiN film was Ta:Ti:N=6:5:8.

The refractive index n and extinction coefficient (refractive index imaginary component) k of the TaTiN film formed as described above at a wavelength of 13.5 nm were each as indicated below.

TaTiN: n=0.943, k=0.026

Next, the upper layer film 42 composed of a TaTiON film was formed on the lower layer film 41 by DC magnetron sputtering. The TaTiON film was deposited at a film thickness of 14.0 nm by reactive sputtering using a TaTi target in a mixed gas atmosphere of Ar gas and $N_2$ gas. The content ratio of the TaTiON film was Ta:Ti:O:N=8:6:1:20.

The refractive index n and extinction coefficient (refractive index imaginary component) k of the TaTiON film formed as described above at a wavelength of 13.5 nm were each as indicated below.

TaTiON: n=0.955, k=0.022

The relative reflectance of the phase shift film 4 composed of the aforementioned two-layer film at a wavelength of 13.5 nm was 7.2% and phase difference was 180 degrees. In addition, reflectance with respect to DUV light was not more than 24.1% over a range of 190 nm to 300 nm.

Next, the reflective mask 200 was fabricated using the aforementioned reflective mask blank 100.

As was previously described, the resist film 11 was formed at a thickness of 100 nm on the phase shift film 4 of the reflective mask blank 100 (FIG. 2(a)). A desired pattern was drawn (exposed) on this resist film 11 followed by developing and rinsing to form a prescribed resist pattern 11a (FIG. 2(b)). Next, using the resist pattern 11a as a mask, the upper layer film 42 of the phase shift film 4 was dry etched using $CF_4$ gas followed by dry etching the lower layer film 41 using $Cl_2$ gas to form the phase shift pattern 4a (FIG. 2(c)).

Subsequently, the resist pattern 11a was removed by ashing or with a resist stripping solution. Finally, it was subjected to wet cleaning with pure water (DIW) to fabricate the reflective mask 200 (FIG. 2(d)).

In the reflective mask 200 of Example 4, since the upper layer film 42 in the form of a TaTiON film serves as an etching mask of the lower layer film 41, the phase shift pattern 4a was able to be formed with high accuracy. In addition, since the film thickness of the phase shift pattern 4a is 59.1 nm, film thickness was able to be reduced by about 9% from the 65 nm for the film thickness of the phase shift film composed of a TaN film in the comparative example to be subsequently described, thereby making it possible to reduce shadowing effects.

A semiconductor device having desired properties was able to be manufactured in the same manner as Example 3 by using the reflective mask 200 fabricated in the present example.

Example 5

Example 5 is an example of the case of changing the film thickness of the lower layer film 41 and changing the upper layer film 42 to a $SiO_2$ film in Example 4, and other conditions are the same as Example 4.

The lower layer film 41 composed of a TaTiN film was deposited at a film thickness of 50.6 nm on the protective film 3 by DC magnetron sputtering. The content ratio of the TaTiN film was Ta:Ti:N=4:6:6. The refractive index n and extinction coefficient (refractive index imaginary component) k of the TaTiN film formed as described above at a wavelength of 13.5 nm were each as indicated below.

TaTiN: n=0.936, k=0.028

Next, the upper layer film 42 composed of a $SiO_2$ film was formed on the lower layer film 41 by RF magnetron sputtering. The $SiO_2$ film was deposited at a film thickness of 3.5 nm by sputtering using a $SiO_2$ target in an Ar gas atmosphere. Thus, the film thickness of the phase shift film 4 (the upper layer film 42 and the lower layer film 41) was 54.1 nm.

The refractive index n and extinction coefficient (refractive index imaginary component) k of the $SiO_2$ film formed as described above at a wavelength of 13.5 nm were each as indicated below.

TaTiON: n=0.974, k=0.013

Figure 7:
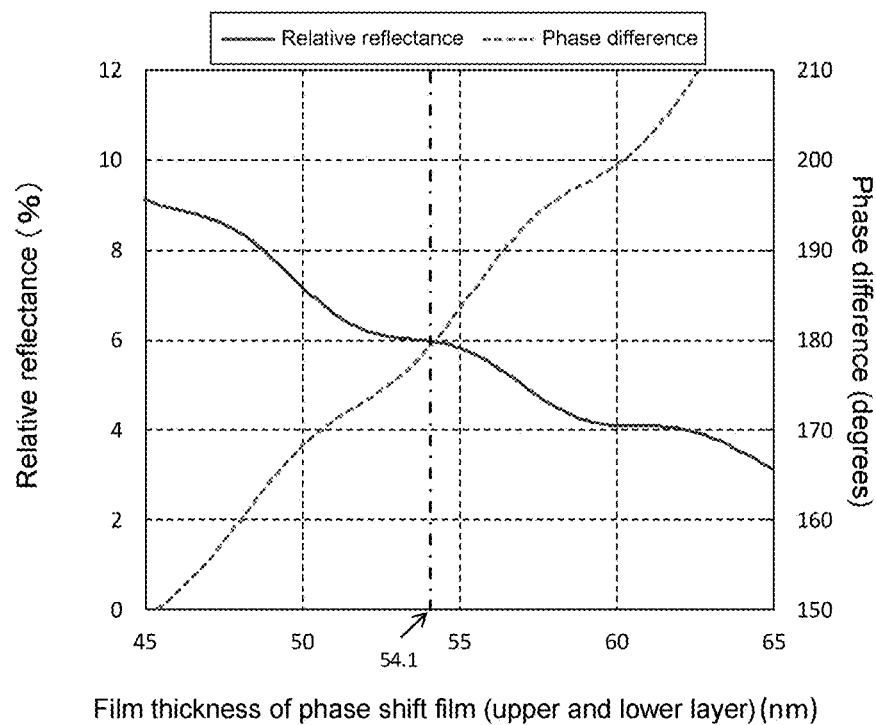
FIG. 7 is a graph indicating the relationship between the thickness of the phase shift film of Example 5 and relative reflectance and phase difference with respect to light having a wavelength of 13.5 nm.

As shown in FIG. 7, the relative reflectance of the phase shift film 4 composed of the aforementioned two-layer film at a wavelength of 13.5 nm was 6.0%±0.03% with respect to film thickness fluctuation of ±0.5%. In addition, the phase difference was 179.4 degrees ±1.1 degrees with respect to a film thickness fluctuation of ±0.5%. As a result, a highly stable phase shift film 4 was obtained.

The reflective mask 200 was fabricated in the same manner as Example 4 using the aforementioned reflective mask blank 100.

In the reflective mask 200 of the present example, since the upper layer film 42 in the form of a $SiO_2$ film serves as an etching mask of the lower layer film 41, the phase shift pattern 4a was able to be formed with high accuracy. In addition, since the film thickness of the phase shift pattern 4a is 54.1 nm, film thickness was able to be reduced by about 17% from the 65 nm for the film thickness of the phase shift film composed of a TaN film in the comparative example to be subsequently described, thereby making it possible to reduce shadowing effects.

A semiconductor device having desired properties was able to be manufactured in the same manner as Example 3 by using the reflective mask 200 fabricated in the present example.

Comparative Example 1

In this comparative example, a reflective mask blank and reflective mask were fabricated with the same structure and using the same method as Example 1 with the exception of using a single-layer TaN film for the phase shift film 4, and a semiconductor device was manufactured using the same method as Example 1.

The single-layer TaN film instead of a TaTiN film was formed on the protective film 3 of the mask blank structure of Example 1. This TaN film was formed by depositing a TaN film by reactive sputtering using a Ta target in a mixed gas atmosphere of Xe gas and $N_2$ gas. The film thickness of the TaN film was 65 nm and the element ratio of this film was 88 at % Ta to 12 at % N.

The refractive index n and extinction coefficient (refractive index imaginary component) k of the TaN film formed as described above at a wavelength of 13.5 nm were each as indicated below.

TaN: n=0.949, k=0.032

The phase difference of a phase shift film composed of the aforementioned single-layer TaN film at a wavelength of 13.5 nm was 180°. Reflectance was 1.7% with respect to the surface of a multilayer reflective film. In this comparative example, there was little phase shift effect and the contrast of projection optical images was unable to be adequately improved.

Subsequently, a resist film was formed on a phase shift film composed of the single-layer TaN film using the same method as Example 1 followed by drawing (exposing) a desired pattern, developing that pattern and rinsing to form a resist pattern. The phase shift film composed of the single-layer TaN film was dry-etched using chlorine gas and using this resist pattern as a mask to form a phase shift pattern. Resist pattern removal, mask cleaning and the like were carried out in the same manner as Example 1 to fabricate a reflective mask.

As was described in the section on a method of manufacturing a semiconductor device of Example 1, investigation shadowing effects using this reflective phase shift mask yielded a value of 2.6 nm for dimension XY difference ΔL.

BRIEF DESCRIPTION OF THE REFERENCE SYMBOLS

1 Substrate
2 Multilayer reflective film
3 Protective film
4 Phase shift film
41 Lower layer film
42 Upper layer film
4a Phase shift pattern
5 Back side conductive film
11 Resist film
11a Resist pattern
100 Reflective mask blank
200 Reflective mask

The invention claimed is:

1. A reflective mask blank comprising:
a substrate;
a multilayer reflective film on the substrate; and
a phase shift film that causes a shift in the phase of EUV light on the multilayer reflective film wherein,
the phase shift film comprises a single layer film or multilayer film of two or more layers and is made of a material comprising tantalum (Ta) and titanium (Ti).

2. The reflective mask blank according to claim 1, wherein the phase shift film has a structure with laminating a lower layer film and an upper layer film in that order from the substrate side,
the lower layer film is made of a material comprising tantalum (Ta), titanium (Ti) and nitrogen (N), and
the upper layer film is made of a material comprising tantalum (Ta), titanium (Ti) and oxygen (O).

3. The reflective mask blank according to claim 1, wherein the phase shift film has a structure with laminating a lower layer film and an upper layer film in that order from the substrate side,
the lower layer film is made of a material comprising tantalum (Ta), titanium (Ti) and nitrogen (N), and
the refractive index of the upper layer film in EUV light is larger than the refractive index of the lower layer film in EUV light and smaller than 1.

4. The reflective mask blank according to claim 3, wherein the upper layer film is made of a material comprising a silicon compound.

5. The reflective mask blank according to claim 1, wherein the reflective mask blank further comprises a protective film between the multilayer reflective film and the phase shift film, and the protective film is made of a material comprising ruthenium (Ru).

6. The reflective mask blank according to claim 1, wherein the reflective mask blank further comprises a conductive film on the side opposite from the side of the substrate provided with the multilayer reflective film, and
the conductive film is made of a material, and the transmittance of the material at least in light having a wavelength of 532 nm is not less than 20%.

7. A reflective mask comprising:
a substrate;
a multilayer reflective film on the substrate; and
a phase shift pattern that causes a shift in the phase of EUV light on the multilayer reflective film, wherein,
the phase shift film pattern comprises a single layer film or multilayer film of two or more layers and is made of a material comprising tantalum (Ta) and titanium (Ti).

8. The reflective mask according to claim 7, wherein the phase shift film pattern has a structure with laminating a lower layer film and an upper layer film in that order from the substrate side,
the lower layer film is made of a material comprising tantalum (Ta), titanium (Ti) and nitrogen (N), and
the upper layer film is made of a material comprising tantalum (Ta), titanium (Ti) and oxygen (O).

9. The reflective mask according to claim 7, wherein the phase shift film pattern has a structure with laminating a lower layer film and an upper layer film in that order from the substrate side,
the lower layer film is made of a material comprising tantalum (Ta), titanium (Ti) and nitrogen (N), and
the refractive index of the upper layer film in EUV light is larger than the refractive index of the lower layer film in EUV light and smaller than 1.

10. The reflective mask according to claim 9, wherein the upper layer film is made of a material comprising a silicon compound.

11. The reflective mask according to claim 7, wherein the reflective mask further comprises a protective film between the multilayer reflective film and the phase shift film pattern, and
the protective film is made of a material comprising ruthenium (Ru).

12. The reflective mask according to claim 7, wherein the reflective mask further comprises a conductive film on the side opposite from the side of the substrate provided with the multilayer reflective film, and
the conductive film is made of a material, and the transmittance of the material at least in light having a wavelength of 532 nm is not less than 20%.

13. A method of manufacturing a semiconductor device, comprising:
placing a reflective mask in an exposure apparatus having an exposure light source that emits EUV light, and
transferring a transfer pattern to a resist film formed on a transferred substrate,
wherein
the reflective mask comprises:
a substrate;
a multilayer reflective film on the substrate; and
a phase shift pattern that causes a shift in the phase of EUV light on the multilayer reflective film, wherein
the phase shift film pattern comprises a single layer film or multilayer film of two or more layers and is made of a material comprising tantalum (Ta) and titanium (Ti).

14. The method of manufacturing a semiconductor device according to claim 13, wherein the phase shift film pattern has a structure with laminating a lower layer film and an upper layer film in that order from the substrate side, the lower layer film is made of a material comprising tantalum (Ta), titanium (Ti) and nitrogen (N), and the upper layer film is made of a material comprising tantalum (Ta), titanium (Ti) and oxygen (O).

15. The method of manufacturing a semiconductor device according to claim 13, wherein the phase shift film pattern has a structure with laminating a lower layer film and an upper layer film in that order from the substrate side, the lower layer film is made of a material comprising tantalum (Ta), titanium (Ti) and nitrogen (N), and the refractive index of the upper layer film in EUV light is larger than the refractive index of the lower layer film in EUV light and smaller than 1.

16. The method of manufacturing a semiconductor device according to claim 15, wherein the upper layer film is made of a material comprising a silicon compound.

17. The method of manufacturing a semiconductor device according to claim 13, wherein the reflective mask further comprises a protective film between the multilayer reflective film and the phase shift film pattern, and the protective film is made of a material comprising ruthenium (Ru).

18. The method of manufacturing a semiconductor device according to claim 13, wherein the reflective mask further comprises a conductive film on the side opposite from the side of the substrate provided with the multilayer reflective film, and the conductive film is made of a material, and the transmittance of the material at least in light having a wavelength of 532 nm is not less than 20%.

* * * * *